United States Patent
Chen et al.

(10) Patent No.: US 7,361,572 B2
(45) Date of Patent: Apr. 22, 2008

(54) STI LINER MODIFICATION METHOD

(75) Inventors: Chien-Hao Chen, Zhaangwei Shiang (TW); Vincent S. Chang, Hsinchu (TW); Chia-Lin Chen, Jhudong Township, Hsinchu County (TW); Tze-Liang Lee, Hsinchu (TW); Shih-Chang Chen, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 270 days.

(21) Appl. No.: 11/059,728

(22) Filed: Feb. 17, 2005

(65) Prior Publication Data

US 2006/0183292 A1   Aug. 17, 2006

(51) Int. Cl.
   *H01L 21/76* (2006.01)
(52) U.S. Cl. ............... 438/435; 438/424; 257/E21.553
(58) Field of Classification Search ............... 438/424, 438/434, 435; 257/E21.553
   See application file for complete search history.

(56) References Cited

U.S. PATENT DOCUMENTS

| | | | | |
|---|---|---|---|---|
| 6,110,793 A | * | 8/2000 | Lee et al. | 438/400 |
| 6,156,620 A | * | 12/2000 | Puchner et al. | 438/400 |
| 2004/0106267 A1 | * | 6/2004 | Beyer et al. | 438/437 |
| 2005/0142797 A1 | * | 6/2005 | Ahn | 438/424 |
| 2005/0151181 A1 | * | 7/2005 | Beintner et al. | 257/301 |
| 2006/0260827 A1 | * | 11/2006 | Clouston | 172/378 |

* cited by examiner

*Primary Examiner*—Bradley K Smith
(74) *Attorney, Agent, or Firm*—Thomas, Kayden, Horstemeyer & Risley

(57) ABSTRACT

A new and improved liner modification method for a liner oxide layer in an STI trench is disclosed. According to the method, an STI trench is etched in a substrate and a liner oxide layer is formed on the trench surfaces by oxidation techniques. The method further includes pre-treatment of the trench surfaces using a nitrogen-containing gas prior to formation of the liner oxide layer, post-formation nitridation of the liner oxide layer, or both pre-treatment of the trench surfaces and post-formation nitridation of the liner oxide layer. The liner modification method of the present invention optimizes the inverse narrow width effect (INWE) and gate oxide integrity (GOI) of STI structures and prevents diffusion of dopant into the liner oxide layer during subsequent processing.

15 Claims, 2 Drawing Sheets

STI LINER MODIFICATION METHOD

FIELD OF THE INVENTION

The present invention relates to shallow trench isolation (STI) procedures for fabricating STI structures in the fabrication of semiconductor integrated circuits. More particularly, the present invention relates to a new and improved STI liner modification method which includes a surface pre-treatment and/or two-step oxidation process in the formation of a trench liner oxide layer to optimize STI corner rounding, retard segregation of dopant into the liner oxide layer and facilitate channel stress management.

BACKGROUND OF THE INVENTION

The fabrication of various solid state devices requires the use of planar substrates, or semiconductor wafers, on which integrated circuits are fabricated. The final number, or yield, of functional integrated circuits on a wafer at the end of the IC fabrication process is of utmost importance to semiconductor manufacturers, and increasing the yield of circuits on the wafer is the main goal of semiconductor fabrication. After packaging, the circuits on the wafers are tested, wherein non-functional dies are marked using an inking process and the functional dies on the wafer are separated and sold. IC fabricators increase the yield of dies on a wafer by exploiting economies of scale. Over 1000 dies may be formed on a single wafer which measures from six to twelve inches in diameter.

Various processing steps are used to fabricate integrated circuits on a semiconductor wafer. These steps include sequential deposition of conductive and insulative layers on the silicon wafer substrate; formation of a photoresist or other mask such as titanium oxide or silicon oxide, in the form of the desired metal interconnection pattern, using standard lithographic or photolithographic techniques; subjecting the wafer substrate to a dry etching process to remove material from one or more conducting layers from the areas not covered by the mask, thereby etching the conducting layer or layers in the form of the masked pattern on the substrate; removing or stripping the mask layer from the substrate typically using reactive plasma and chlorine gas, thereby exposing the top surface of the conductive interconnect layer; and cooling and drying the wafer substrate by applying water and nitrogen gas to the wafer substrate.

The numerous processing steps outlined above are used to cumulatively apply multiple electrically conductive and insulative layers on the wafer and pattern the layers to form the circuits. Additional techniques, such as dual damascene processes, are used to form conductive vias which establish electrical contact between vertically-spaced conductive lines or layers in the circuits. The finished semiconductor product includes microelectronic devices including transistors, capacitors and resistors that form the integrated circuits on each of multiple die on a single wafer.

In the semiconductor industry, CMOS (complementary metal-oxide semiconductor) technology is extensively used in the fabrication of IC devices. CMOS technology typically involves the use of overlying layers of semiconductor material with the bottom layer being a dielectric layer and the top layer being a layer of doped silicon material that serves as a low-resistivity electrical contact gate electrode. The gate electrode, also referred to as a gate stack, typically overlies the dielectric layer.

In the semiconductor fabrication industry, silicon oxide ($SiO_2$) is frequently used for its insulating properties as a gate oxide or dielectric. As the dimensions of device circuits on substrates become increasingly smaller, the gate dielectric thickness must decrease proportionately in field effect transistors (FETs) to approximately 3 to 3.5 nonometers. Accordingly, device performance and reliability can be adversely affected by such factors as interfacial defects, defect precursors and diffusion of dopants through gate dielectrics, as well as unintended variations in thickness in the gate oxide layer among central and peripheral regions of the layer.

Two types of CMOS device structures which are commonly fabricated in semiconductor technology include the MOSCAP (metal oxide semiconductor capacitor) structure and the MOSFET (metal oxide semiconductor field effect transistor) structure. Both of these structures include a substrate on which is deposited a dielectric layer having a high dielectric constant (k), such as a pad oxide layer. A silicon-containing gate, or gate stack, is deposited on the dielectric layer and connects a pair of trench oxide layers (in the case of a MOSCAP structure) or source and drain regions (in the case of a MOSFET structure).

FIG. 1 is a cross-section of an example of a polysilicon gate 20 formed between a source 16 and a drain 18 of a device 30 on a semiconductor wafer substrate 10. An STI (shallow trench isolation) structure 32 includes a shallow trench 12 filled with oxide 14 and separates devices from each other on the wafer substrate 10. A polysilicon silicide, or polycide 22, typically composed of nickel or cobalt, is deposited on the polysilicon gate 20, and an insulating layer 28 is deposited on the polycide 22. A source silicide 24 is deposited on the source 16, and a drain silicide 26 is deposited on the drain 18.

As shown in FIG. 2, an STI structure 36 is fabricated by initially depositing a pad oxide layer 42 on a silicon substrate 40 and a silicon nitride layer 44 on the pad oxide layer 42. One or more trenches 38 is etched through the silicon nitride layer 44 and the pad oxide layer 42, into the substrate 40. A liner oxide layer 46 is then deposited on the sidewalls and bottom of the trench or trenches 38. After a liner densification step, each trench 38 is filled with a trench oxide 48, followed by chemical mechanical planarization of the oxide layer 50 above the trench oxides 48.

The profile of the STI trench 38 is critical for proper CMOS transistor operation. The shape of the top corners 52 of the trench 38 impacts the inverse narrow width effect (INWE), as well as the gate oxide integrity (GOI). The shape of the bottom corners 54 is closely related to junction leakage. Additionally, dopant segregation and STI stress control are important for optimum device performance and reliability.

Conventional methods of suppressing the INWE have included tilted sidewall implantation and edge implantation. Furthermore, shallow trench isolation using nitric oxide-annealed liner oxide layer has been shown to prevent out-diffusion of boron through the liner oxide layer. For stress control of STI processing, oxide-nitride layers or a triple layer of oxide-nitride-oxide have been used to relieve STI stress.

From a production point of view, tilted sidewall implantation and edge implantation suffer from the disadvantage of requiring additional photolithographic work to protect the pmos region. Furthermore, while it is a relatively simple method, shallow trench isolation using nitric oxide-annealed liner oxide layer results in a liner oxide layer in which the nitrogen concentration is very low (<2%). Thus, the improvement in restriction of boron out-diffusion is low. Finally, the use of oxide-nitride layers or a triple layer of oxide-nitride-oxide as the liner oxide layer results in a liner oxide layer which is rather thick (in the range of 200~600 angstroms). This thickness is excessive for sub-micron technology. Additionally, the pad removal step causes phosphoric acid to recess the nitride layer, forming a gap which leads to an unacceptably large void in the layer. Accordingly, a new and improved STI liner modification method is needed which optimizes STI trench corner rounding, retards dopant segregation into a liner oxide layer and reduces the STI stress affect during STI fabrication.

An object of the present invention is to provide a new and improved STI liner modification method for a liner oxide layer in an STI trench.

Another object of the present invention is to provide a new and improved liner modification method which optimizes corner faceting of an STI trench.

Still another object of the present invention is to provide a new and improved liner modification method which optimizes the inverse narrow width effect (INWE) and gate oxide integrity (GOI) of a semiconductor device, enhancing device performance.

Yet another object of the present invention is to provide a new and improved liner modification method which is effective in controlling the nitrogen profile and concentration in a liner oxide layer of an STI structure in order to prevent diffusion of dopant into the liner oxide layer, thus controlling the INWE.

A still further object of the present invention is to provide a new and improved liner modification method by which a high concentration of nitrogen can be introduced into a liner oxide layer in an STI trench for enhanced STI stress management, facilitating enhanced device performance.

Another object of the present invention is to provide a new and improved liner modification method which typically does not require additional lithography steps beyond the usual lithography steps required to fabricate a shallow trench isolation structure.

Another object of the present invention is to provide a new and improved liner modification method which includes etching of an STI trench in a substrate and formation of a liner oxide layer on the trench surfaces by an oxidation process, and which method further includes pre-treatment of the trench surfaces with nitrogen prior to formation of the layer, post-formation nitridation of the layer, or both.

SUMMARY OF THE INVENTION

In accordance with these and other objects and advantages, the present invention is generally directed to a new and improved liner modification method for a liner oxide layer in an STI trench. According to the method, an STI trench is etched in a substrate and a liner oxide layer is formed on the trench surfaces by oxidation techniques. The method further includes pre-treatment of the trench surfaces using a nitrogen-containing gas prior to formation of the liner oxide layer, post-formation nitridation of the liner oxide layer, or both pre-treatment of the trench surfaces and post-formation nitridation of the liner oxide layer. The liner modification method of the present invention optimizes the inverse narrow width effect (INWE) and gate oxide integrity (GOI) of STI structures, enhancing the device performance of semiconductor devices fabricated on a substrate. Furthermore, the method is effective in controlling the nitrogen profile and concentration in a liner oxide layer in order to prevent diffusion of dopant into the liner oxide layer, thus reducing the INWE (inverse narrow width effect).

BRIEF DESCRIPTION OF THE DRAWINGS

The invention will now be described, by way of example, with reference to the accompanying drawings, in which.

DETAILED DESCRIPTION OF THE INVENTION

The present invention contemplates a new and improved liner modification method for a liner oxide layer which lines trench surfaces in an STI trench. The liner modification method of the present invention optimizes the inverse narrow width effect (INWE) and gate oxide integrity (GOI) of STI structures. This enhances the device performance of semiconductor devices fabricated on a substrate. The method is also effective in controlling the nitrogen profile and concentration in a liner oxide layer in order to prevent diffusion of dopant into the liner oxide layer, thus reducing the INWE (inverse narrow width effect).

According to the method, an STI trench is etched in a substrate and a liner oxide layer is formed on the trench surfaces by oxidation techniques. The method further includes pre-treatment of the trench surfaces using a nitrogen-containing gas prior to formation of the liner oxide layer, post-formation nitridation of the liner oxide layer, or both pre-treatment of the trench surfaces and post-formation nitridation of the liner oxide layer. The liner oxide layer may be formed on the typically pre-treated trench surfaces using a two-step oxidation process which promotes rounding of the top and bottom corners of the trench.

Pre-treatment of the trench surfaces with nitrogen prior to formation of the liner oxide layer, in combination with post-formation nitridation treatment of the layer, optimizes rounding of the top and bottom corners of the STI trench. Rounding of the top trench corners reduces the inverse narrow width effect (INWE) and enhances gate oxide integrity (GOI). Rounding of the bottom trench corners reduces or eliminates liner dislocation and junction leakage. The nitrogen pre-treatment and nitridation treatment steps also prevent diffusion of dopant into the liner oxide layer, thereby controlling the INWE. Nitridation treatment of the liner oxide layer facilitates STI stress management, resulting in enhanced device performance. The method of the present invention typically requires no additional lithographic work beyond that normally required for the formation of STI structures.

Figure 1:
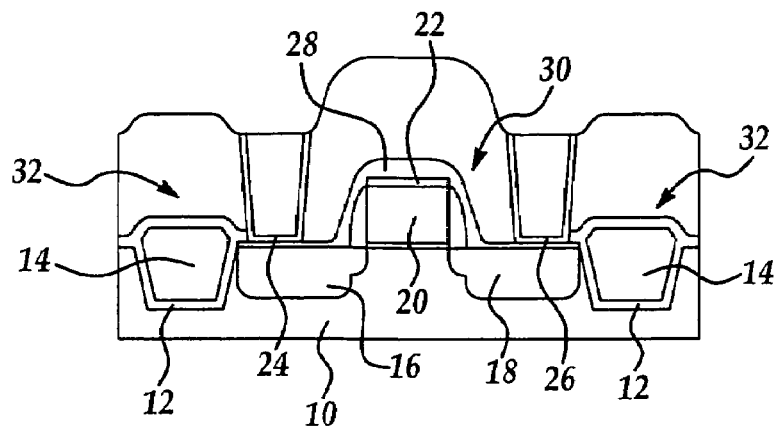
FIG. 1 is a cross-section of a semiconductor device fabricated on a substrate, with two STI structures separating the device from adjacent devices (not shown)
Figure 2:
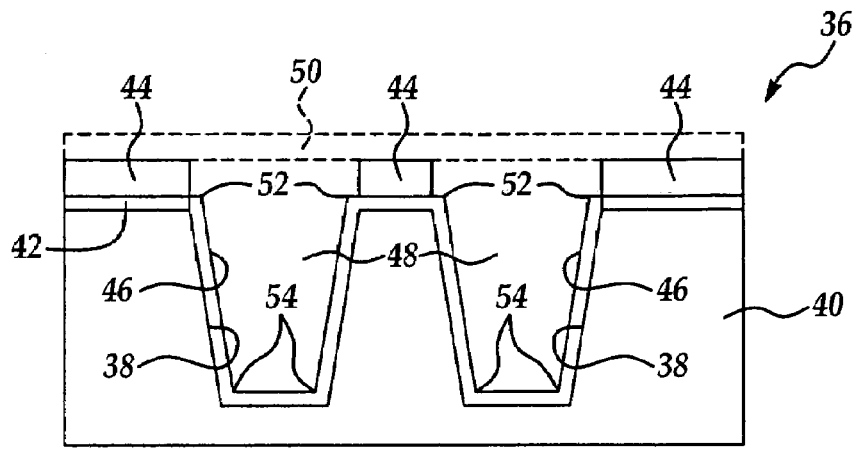
FIG. 2 is a cross-section of a pair of STI trenches etched in a substrate and a liner oxide layer formed on the surfaces of the trenches using a conventional method.
Figure 3:
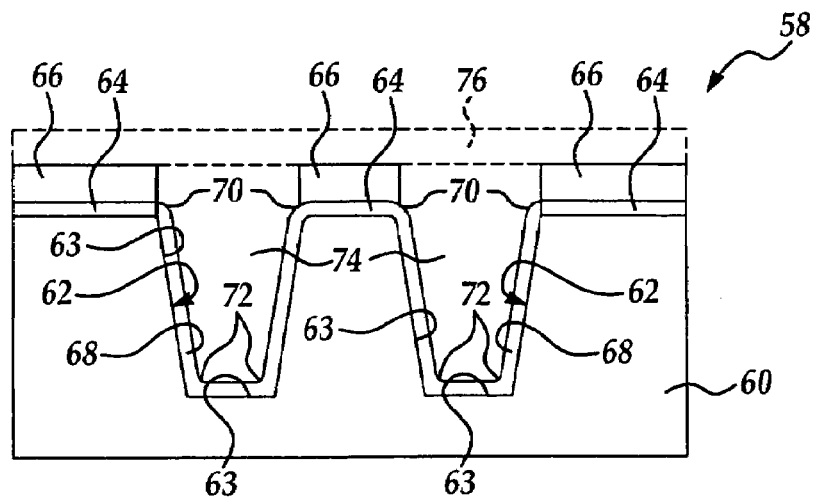
FIG. 3 is a pair of STI trenches fabricated according to the liner modification method of the present invention.

Referring next to FIG. 3, an STI structure 58 fabricated according to the STI liner modification method of the present invention is shown. The STI structure 58 includes one or multiple trenches 62 provided in a typically silicon substrate 60. A pad oxide layer 64 and a silicon nitride layer 66 are sequentially provided on the substrate 60. A liner oxide layer 68 lines the side and bottom surfaces 63 of each trench 62. The top corners 70 and bottom corners 72 of each trench 62 typically have a generally rounded configuration. A trench oxide 74 fills each trench 62, and an oxide layer 76 overlies the silicon nitride layer 66.

According to the method of the present invention, the side and bottom surfaces 63 of each trench 62 are pre-treated with nitrogen prior to formation of the liner oxide layer 68 thereon. Alternatively or in addition, the liner oxide layer 68 is nitridated. Preferably, both the side and bottom surfaces 63 of each trench 62 are pre-treated with nitrogen and the liner oxide layer 68 is nitridated. The liner oxide layer 68 is formed on the pre-treated surfaces 63 of the trench 62 typically using a two-step oxidation process which enhances rounding of the top trench corners 70 and bottom trench corners 72.

Figure 4:
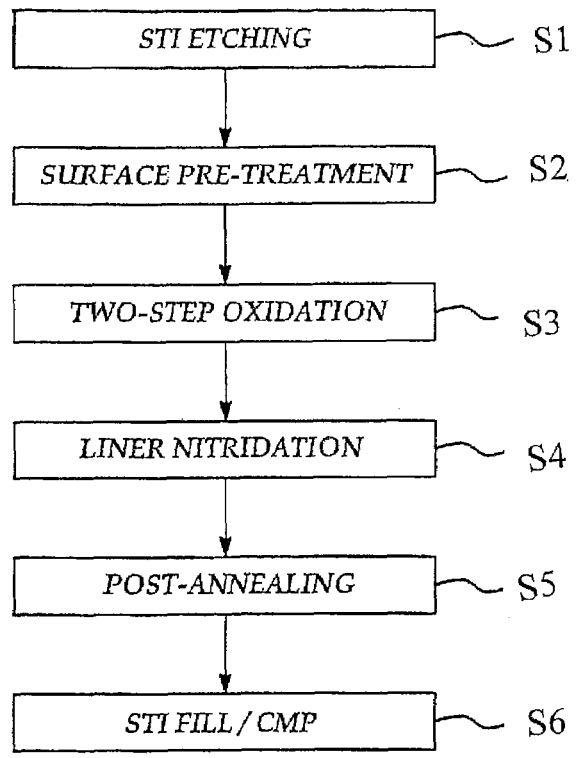
FIG. 4 is a flow diagram illustrating a typical sequence of process steps according to the liner modification method of the present invention.
Figure 5A:
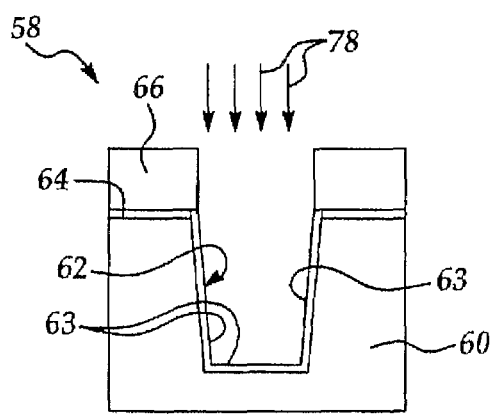
FIG. 5A is a cross-section of an STI trench fabricated according to the method of the present invention, more particularly illustrating a trench surface pre-treatment step.
Figure 5B:
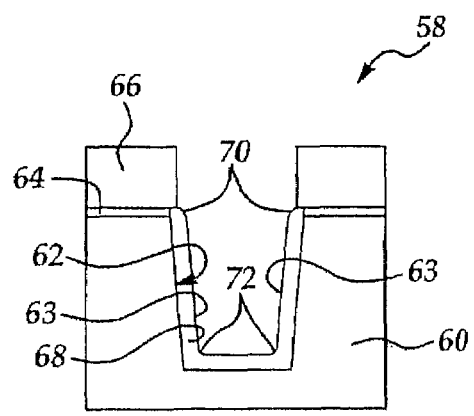
FIG. 5B is a cross-section of an STI trench fabricated according to the method of the present invention, more particularly illustrating nitridation of a liner oxide layer formed on the trench surfaces.

Referring next to FIG. 4, in conjunction with FIGS. 3, 5A and 5B, the STI liner modification method of the present invention is begun by etching the trench or trenches 62 in the substrate 60, as indicated in step S1 of FIG. 4. The trench-formation step can be carried out using conventional photolithography and etching techniques. Furthermore, the trench depth, angles and corner exposure can be tuned depending on the particular application, according to the knowledge of those skilled in the art.

As indicated in step S2, the side and bottom trench surfaces 63 are subjected to a surface pre-treatment step, in which nitrogen 78 is directed against the trench surfaces 63 exposed by the etching step S1, as shown in FIG. 5A. This step can be accomplished without the use of additional lithography. The surface pre-treatment step S2 facilitates incorporation of nitrogen into the silicon trench surfaces 63 at a concentration of preferably about 3~30 atomic percent, causing the growth rate of the subsequent liner oxide layer 68 thereon to be dependent on liner oxide crystallization. The nitrogen pre-treated trench surface 63 has a gradient nitrogen concentration profile, with a nitrogen concentration variation ranging from typically about 3~30 atomic percent. The top or exposed surface of the trench surface 63 has the greatest nitrogen concentration, which progressively decreases in underlying regions beneath the top or exposed surface. Furthermore, rounding of the bottom trench corners 72 is enhanced by this step.

The surface pre-treatment step S2 is carried out typically using either a plasma nitridation approach or a thermal nitridation approach. According to the plasma nitridation approach, the substrate 60 is placed in a plasma processing chamber (not shown) and nitrogen plasma is used to incorporate nitrogen into the trench surfaces 63. Any suitable nitrogen-containing gas, such as $N_2$, $NH_3$, $N_2O$ or NO, for example, may be used as the plasma-forming gas. Typical process parameters for the plasma nitridation approach include a chamber pressure of typically about 5 mtorr~800 mtorr, a power of typically about 100 KW~200 KW, a processing temperature of typically about 20~600 degrees C., and a process time of typically about 1 sec.~10 min.

According to the thermal nitridation approach, the substrate 60 is placed in a thermal processing chamber, for example. Any suitable nitrogen-containing gas, such as $NH_3$, $N_2O$ or NO, for example, may be used as the nitrogen-carrying gas. Typical process parameters for the thermal nitridation approach include a chamber pressure of typically about 10~100 torr, a process temperature of typically about 800~1000 degrees C., and a process time of typically about 0.5~10 min.

As indicated in step S3, the liner oxide layer 68 is next formed on the nitrogen pre-treated trench surfaces 63. This is preferably carried out using a two-step oxidation process which enhances rounding of the top trench corners 70 and bottom trench corners 72, as shown in FIGS. 3 and 5B. The two-step oxidation process S3 may be carried out in a thermal processing furnace or a rapid thermal processing (RTP) chamber, for example.

According to the two-step oxidation process S3, the substrate 60 is initially placed in the thermal processing furnace or rapid thermal processing chamber. In a first oxidation step, the chamber temperature is ramped up to typically about 700~900 degrees C. in an $H_2$ ambient for typically about 10~100 sec., to promote migration of silicon along the trench surfaces 63. In the second oxidation step, the chamber temperature is ramped up to typically about 1000~1100 degrees C. in an $O_2$ ambient to facilitate oxidation of the silicon along the trench surfaces 63. Depending on the particular application, the thickness range for the liner oxide layer 68 is typically about 50~200 angstroms.

After the two-step oxidation process S3, the liner oxide layer 68 is typically subjected to a liner nitridation step S4. In the liner nitridation step S4, the nitrogen concentration and profile of the liner oxide layer 68 is controlled to prevent diffusion of dopant into the liner oxide layer 68 and to manage STI stress. The liner nitridation step S4 may be carried out typically according to either a plasma nitridation approach or a thermal nitridation approach. Either approach can be used to precisely control the nitrogen concentration (typically about 0~30 percent) of the liner oxide layer 68. Preferably, the nitridated liner oxide layer 68 has a nitrogen concentration of about 2~30 atomic percent. The liner oxide layer 68 has a nitrogen concentration gradient with a variation larger than typically about 3 atomic percent.

According to the plasma nitridation approach, nitrogen plasma is used to incorporate nitrogen into the liner oxide layer 68, using suitable nitrogen-containing gas such as $N_2$, $NH_3$, $N_2O$ or NO, for example, as the nitrogen plasma precursor. Typical process parameters for the plasma nitridation approach include a chamber pressure of typically about 5 mtorr~800 mtorr, a power of typically about 100 KW~200 KW, a processing temperature of typically about 20~600 degrees C., and a processing time of typically about 1 sec.~10 min.

According to the thermal nitridation approach, any suitable nitrogen-containing gas, such as $NH_3$, $N_2O$ or NO, for example, may be used as the nitrogen-carrying gas. Typical process parameters for the thermal nitridation approach include a chamber pressure of typically about 10~100 torr, a process temperature of typically about 800~1000 degrees C., and a process time of typically about 0.5~10 min.

After the liner nitridation step S4, the liner oxide layer 68 may be subjected to an optional post-annealing step S5 to densify and reduce the trap density of the nitrided liner oxide layer 68, as well as to eliminate layer dislocation and release STI stress. The post-annealing step S5 may be carried out in an $H_2/NO/O_2$ gas mixture in a thermal processing furnace or RTP chamber, for example. Typical process conditions include a process temperature of typically about 900~1100 degrees C. and a process time of typically about 0.1~10 min.

Following the optional post-annealing step S5, an STI fill/CMP step S6 is carried out. At the STI fill step, each trench 62 is filled with a trench oxide 74 and an oxide layer 76 is formed on the silicon nitride layer 66. At the CMP step, the oxide layer 76 is subjected to chemical mechanical planarization (CMP) to planarize the oxide layer 76. The STI fill/CMP step S6 may be carried out using conventional methods known by those skilled in the art.

While the preferred embodiments of the invention have been described above, it will be recognized and understood that various modifications can be made in the invention and the appended claims are intended to cover all such modifications which may fall within the spirit and scope of the invention.

What is claimed is:

1. An STI liner modification method, comprising:
providing a substrate;
providing a trench having trench surfaces in said substrate;
pre-treating said trench surfaces with nitrogen-base condition to provide said trench surfaces with a nitrogen concentration above 3 atom percent; and
sequentially heat treating said trench surfaces in a first gas ambient and a second gas ambient to form a liner oxide layer on said trench surfaces, wherein the first gas ambient is different from the second gas ambient.

2. The method of claim 1 further comprising the step of annealing said liner oxide layer.

3. The method of claim 1 wherein said first and second gas ambients are $H_2$ and $O_2$ ambients, respectively.

4. The method of claim 1 wherein trench surfaces is pre-treated by a plasma nitridation approach or a thermal nitridation approach.

5. The method of claim 1 wherein the nitrogen concentration of said trench surfaces is about 3-30 atom percent.

6. An STI liner modification method, comprising:
providing a substrate;
providing a trench having trench surfaces in said substrate;
sequentially heat treating said trench surfaces in a first gas ambient and a second gas ambient to form a liner oxide layer on said trench surfaces, wherein the first gas ambient is different from the second gas ambient; and
subjecting said liner oxide layer to a liner-nitridation step to provide said liner oxide layer with a nitrogen concentration above 2 atom percent.

7. The method of claim 6 further comprising the step of annealing said liner oxide layer.

8. The method of claim 6 wherein said first and second gas ambients are $H_2$ and $O_2$ ambients, respectively.

9. The method of claim 6 wherein said subjecting said liner oxide layer to a liner-nitridation step comprises subjecting said liner oxide layer to a liner-nitridation step using a plasma nitridation approach.

10. The method of claim 6 wherein said subjecting said liner oxide layer to a liner-nitridation step comprises subjecting said liner oxide layer to a liner-nitridation step using a thermal nitridation approach.

11. The method of claim 6 wherein the nitrogen concentration of said liner oxide layer is about 2-30 atom percent.

12. An STI liner modification method, comprising:
providing a substrate;
providing a trench having trench surfaces in said substrate;
pre-treating said trench surfaces with nitrogen-base condition by a thermal nitridation approach to provide said trench surfaces with a nitrogen concentration above 3 atom percent;
forming a liner oxide layer on said treated trench surfaces; and
subjecting said liner oxide layer to a liner-nitridation step to provide said liner oxide layer with a nitrogen concentration above 2 atom percent.

13. The method of claim 12 further comprising the step of annealing said liner oxide layer.

14. The method of claim 12 wherein said forming a liner oxide layer on said trench surfaces comprises forming a liner oxide layer on said trench surfaces using a two-step oxidation process.

15. The method of claim 14 further comprising the step of annealing said liner oxide layer.

* * * * *